United States Patent
Li et al.

(10) Patent No.: US 12,241,199 B2
(45) Date of Patent: Mar. 4, 2025

(54) TREATMENT AGENT FOR ELECTRONIC-GRADE LOW-DIELECTRIC FIBERGLASS CLOTH, AND PREPARATION METHOD THEREOF

(71) Applicant: TAISHAN FIBERGLASS ZOUCHENG CO., LTD., Zoucheng (CN)

(72) Inventors: Wei Li, Zoucheng (CN); Qiang Fang, Zoucheng (CN); Huaqing Xiao, Zoucheng (CN); Yingying Zhang, Zoucheng (CN); Dongfeng Liu, Zoucheng (CN); Siqi Niu, Zoucheng (CN); Lin Wei, Zoucheng (CN); Xiaochen Wang, Zoucheng (CN)

(73) Assignee: TAISHAN FIBERGLASS ZOUCHENG CO., LTD., Zoucheng (CN)

( * ) Notice: Subject to any disclaimer, the term of this patent is extended or adjusted under 35 U.S.C. 154(b) by 0 days.

(21) Appl. No.: 18/561,726

(22) PCT Filed: May 7, 2022

(86) PCT No.: PCT/CN2022/091363
§ 371 (c)(1),
(2) Date: Nov. 16, 2023

(87) PCT Pub. No.: WO2022/247607
PCT Pub. Date: Dec. 1, 2022

(65) Prior Publication Data
US 2024/0240388 A1  Jul. 18, 2024

(30) Foreign Application Priority Data
Nov. 30, 2021 (CN) .......................... 202111440929.2

(51) Int. Cl.
*D06M 15/513* (2006.01)
*D06M 13/144* (2006.01)
*D06M 13/513* (2006.01)
*D06M 15/227* (2006.01)

(52) U.S. Cl.
CPC ...... *D06M 13/5135* (2013.01); *D06M 13/144* (2013.01); *D06M 15/227* (2013.01)

(58) Field of Classification Search
CPC ........... D06M 13/5135; D06M 13/144; D06M 15/227; D06M 13/513; C03C 25/1095; C03C 25/40; H05K 1/0366
See application file for complete search history.

(56) References Cited

U.S. PATENT DOCUMENTS

| | | | | |
|---|---|---|---|---|
| 3,855,175 | A * | 12/1974 | Kakizaki | C03C 25/40 523/213 |
| 6,270,897 | B1 * | 8/2001 | Flautt | C08K 9/06 428/378 |
| 2009/0206296 | A1 * | 8/2009 | Dave | C11D 3/43 252/8.61 |

FOREIGN PATENT DOCUMENTS

| | | |
|---|---|---|
| CN | 103556461 B | 8/2015 |
| CN | 106543554 A | 3/2017 |
| CN | 106868866 A | 6/2017 |
| CN | 107119455 A | 9/2017 |
| CN | 105401423 B | 4/2018 |
| CN | 110981222 A | 4/2020 |
| CN | 112695520 A | 4/2021 |
| CN | 112813684 A | 5/2021 |
| CN | 113914099 A | 1/2022 |
| JP | H11236249 A | 8/1999 |
| WO | 02092903 A1 | 11/2002 |

OTHER PUBLICATIONS

Machine translation of CN 113914099 A, retrieved Sep. 2024 (Year: 2024).*

* cited by examiner

*Primary Examiner* — Katarzyna I Kolb
(74) *Attorney, Agent, or Firm* — Bayramoglu Law Offices LLC

(57) ABSTRACT

A treatment agent for an electronic-grade low-dielectric fiberglass cloth, and a preparation method thereof are provided. The treatment agent for an electronic-grade low-dielectric fiberglass cloth is prepared from the following raw materials in weight percentages: a coupling agent A: 0.6% to 1.2%, a coupling agent B: 0.3% to 0.8%, a coupling agent additive: 0.01% to 1.5%, an alcohol: 0.1% to 0.5%, an acid: 0.1% to 0.5%, and water: the balance, where the coupling agent A is a vinyl-containing coupling agent; the coupling agent B is a vinylbenzyl-containing coupling agent; and the coupling agent additive is a salt of a maleic anhydride (MA)-grafted copolymer. On the basis of meeting the low dielectric performance, the treatment agent of the present disclosure improves the binding performance of the low-dielectric fiberglass cloth to a low-dielectric customer resin and enhances the mechanical performance and heat resistance of the low-dielectric fiberglass cloth.

17 Claims, No Drawings

TREATMENT AGENT FOR ELECTRONIC-GRADE LOW-DIELECTRIC FIBERGLASS CLOTH, AND PREPARATION METHOD THEREOF

CROSS REFERENCE TO THE RELATED APPLICATIONS

This application is the national phase entry of International Application No. PCT/CN2022/091363, filed on May 7, 2022, which is based upon and claims priority to Chinese Patent Application No. 202111440929.2, filed on Nov. 30, 2021, the entire contents of which are incorporated herein by reference.

TECHNICAL FIELD

The present disclosure belongs to the technical field of glass fiber treatment agents, and specifically relates to a treatment agent for an electronic-grade low-dielectric fiberglass cloth, and a preparation method thereof.

BACKGROUND

With the rapid development of the 5G technology, the requirements for printed circuit board (PCB) materials in high-frequency and high-speed application fields are increasingly high, which inevitably brings advanced requirements for a treatment agent for an electronic-grade fiberglass cloth as one of the constituent materials of copper clad laminate (CCL). Most of the current PCB materials are epoxy resin systems that have relatively low requirements for a dielectric constant and a dielectric loss, but for some ultra-thin cloth integrated circuit (IC) packaging carrier boards, high-frequency and high-speed boards, or the like, the existing treatment agent formulas cannot meet the requirements of matching performance of low-dielectric resin systems. Therefore, it is of great significance to develop a treatment agent formula for an electronic-grade low-dielectric fiberglass cloth. When in use, the current treatment agent formulas for low-dielectric fiberglass cloths face problems such as long penetration time and bubbles in customer products due to poor impregnation performance.

For example, the patent CN103556461B discloses a surface treatment agent for an electronic-grade fiberglass cloth, and the treatment agent is prepared from a silane coupling agent (SCA) with a general formula of $Y(CH_2)_nSiX_3$, acetic acid, and deionized water, where Y represents an organic functional group, which is vinyl, amino, epoxy, methacryloyloxy, mercapto, or carbamido; and X represents a hydrolyzable group, which is chloro, methoxy, ethoxy, methoxyethoxy, or acetoxy. An electronic-grade fiberglass cloth produced with the treatment agent formula in combination with a pretreatment process has advantages such as high heat resistance, ion migration resistance, and fast resin wettability.

The patent CN107119455A discloses a post-treatment agent for a fiberglass cloth, which is prepared from the following raw materials: vinyl-containing SCAA, epoxy-containing SCAB, a pH adjusting agent, a surfactant, and deionized water, where a content of the SCA A is 1.1 to 1.5 times of a content of the SCA B. The post-treatment agent has excellent storage stability, strong adhesion to a resin, and a specified degree of rigidity.

The patent CN105401423B discloses a post-treatment agent for an electronic-grade fiberglass cloth, which is prepared from the following components: a pH adjusting agent, amino-SCA, a fluorocarbon surfactant, and deionized water. An electronic-grade fiberglass cloth treated by this treatment agent has advantages such as high mechanical strength, excellent heat resistance, and high product yield rate.

The coupling agent hydrolysis processes involved in the above patents are conventional hydrolysis methods for coupling agents; and the surfactant is used to reduce a surface tension of a solution and reduce the generation of bubbles during use, but for low-dielectric fiberglass cloths, a fluorocarbon surfactant or a hydrocarbon surfactant added will adsorb salt ions to affect the electrical performance of an electronic cloth. Therefore, it is necessary to solve the problems in selection of a treatment agent and matching of the treatment agent with a resin type, especially problems in adhesion of a treatment agent to a low-dielectric resin such as polyphenylene oxide (PPO).

SUMMARY

Technical problems to be solved by the present disclosure: The present disclosure provides a treatment agent for an electronic-grade low-dielectric fiberglass cloth, where while meeting the low dielectric performance, the treatment agent improves the binding performance of the low-dielectric fiberglass cloth to a resin and enhances the mechanical performance and heat resistance of the low-dielectric fiberglass cloth; and the present disclosure also provides a preparation method of the treatment agent.

The treatment agent for an electronic-grade low-dielectric fiberglass cloth of the present disclosure is prepared from the following raw materials in weight percentages: a coupling agent A: 0.6% to 1.2%, a coupling agent B: 0.3% to 0.8%, a coupling agent additive: 0.01% to 1.5%, an alcohol: 0.1% to 0.5%, an acid: 0.1% to 0.5%, and water: the balance.

The coupling agent A is a vinyl-containing coupling agent.

Preferably, a general structural formula of the coupling agent A is $CH_2=CH(CH_2)_nSiX_3$, where n is an integer of 0 to 3, and X is a hydrolyzable group and is preferably methoxy, ethoxy, methoxyethoxy, acetoxy, or peroxy.

Further preferably, the coupling agent A is one or more of vinyltriethoxysilane, vinyltris(β-methoxyethoxy)silane, propylenetrimethoxysilane, and vinyltriisopropoxysilane.

A content of the coupling agent A is 0.6% to 1.2% and preferably 0.8% to 1.1%. If the content of the coupling agent A is too low, there will be a small number of non-polar groups and an addition reaction with a resin will be slowed down; and if the content of the coupling agent A is too high, there will be ineffective accumulation of the coupling agent on a surface of a fiberglass cloth, and after be placed for a long period, the coupling agent will further undergo polycondensation to produce inefficient components, which increases a cost.

The coupling agent B is a vinylbenzyl-containing coupling agent.

Preferably, a general structural formula of the coupling agent B is $CH_2=CH(C_6H_4)CH_2(CH_2)_nSiX_3$, where n is an integer of 0 to 3, and X is a hydrolyzable group and is preferably methoxy, ethoxy, methoxyethoxy, acetoxy, or peroxy.

Further preferably, the coupling agent B is one or more of vinylbenzyltriethoxysilane, β-(vinylbenzyl)propyltriethoxysilane, vinylbenzyltrimethoxysilane, and vinylbenzylisopropoxysilane.

A content of the coupling agent B is 0.3% to 0.8% and preferably 0.4% to 0.6%. If the content of the coupling agent B is too low, only a small number of free radicals will be provided, which reduces a reaction rate between the coupling agent and a resin; and if the content of the coupling agent B is too high, there will be ineffective accumulation of the coupling agent on a surface of a fiberglass cloth, and after be placed for a long period, the coupling agent will further undergo polycondensation to produce inefficient components, which increases a cost.

A content ratio of the coupling agent A to the coupling agent B is (1.2-2.3):1. If the content ratio of the coupling agent A to the coupling agent B is too high, an effect of vinylbenzyl in the coupling agent B to provide stable electrons is reduced; and if the content ratio of the coupling agent A to the coupling agent B is too low, an effect of non-polar groups in the coupling agent A to participate in a reaction with a resin is reduced.

The coupling agent A and the coupling agent B are used in combination. The coupling agent A includes non-polar groups, which can not only reduce a surface tension, but also undergo an addition reaction with a low-dielectric resin system (such as a PPO resin); and a small-molecule short-chain coupling agent is adopted, which has a small molecular weight, a large capillary force, and strong permeability and can well penetrate into glass fibers. The coupling agent B includes vinylbenzyl, which has heat resistance, lubricity, and electronic stability, and can rapidly produce free radicals to accelerate a reaction with a low-dielectric resin while enhancing the heat resistance.

The coupling agent additive is a salt of an MA-grafted copolymer.

Preferably, the coupling agent additive is one or more of a sodium salt of a butadiene-MA copolymer, an ammonium salt of a butadiene-MA copolymer, a sodium salt of a dimethyldiallyl-MA copolymer, and an amine salt of a dimethyldiallyl-MA copolymer.

A content of the coupling agent additive is 0.01% to 1.5% and preferably 0.05% to 1.0%. If the content of the coupling agent additive is too high, coupling effects of the coupling agent A and the coupling agent B will be inhibited and a raw material cost will be increased; and if the content of the coupling agent additive is too low, strengthening effects of the coupling agents binding to a resin will be weakened.

Acid anhydride groups in the coupling agent additive can undergo a generalized dehydration reaction with the polar groups (—$NH_2$ and —OH) to produce chemical bonds, such that incompatible polar and non-polar substances are chemically coupled, thereby further strengthening the binding of the coupling agents to a resin.

The acid is a small-molecule organic acid with 1 to 5 carbon atoms, and is preferably formic acid or acetic acid. A pH of the treatment agent is adjusted with the acid to a suitable range.

The alcohol is a small-molecule organic alcohol with 1 to 5 carbon atoms, and is preferably methanol, ethanol, or glycerol.

Compared with the traditional addition of a surfactant, the use of an alcohol as a cosolvent can increase the solubilities of the coupling agents, reduce a surface tension of a solution, and promote the binding of the treatment agent to glass fibers; and the alcohol can volatilize in the subsequent drying step, which reduces the interference with a reaction between the coupling agents and a resin.

The preparation method of the treatment agent for an electronic-grade low-dielectric fiberglass cloth of the present disclosure includes the following steps:

(1) adding pure water to a preparation tank, and starting stirring;

(2) thoroughly mixing the acid and the alcohol by a stirrer, and adding a resulting mixture to the preparation tank;

(3) adding the coupling agent A and the coupling agent B successively to the preparation tank, and stirring until a resulting aqueous solution is clear and transparent; and (4) adding the coupling agent additive to the preparation tank, and thoroughly stirring to obtain the treatment agent for an electronic-grade low-dielectric fiberglass cloth.

The treatment agent for an electronic-grade low-dielectric fiberglass cloth has a pH of 4 to 6, and after being prepared, the treatment agent is stored under low-speed stirring for later use.

Compared with the prior art, the present disclosure has the following beneficial effects:

(1) In the present disclosure, a vinyl-containing coupling agent A and a vinylbenzyl-containing coupling agent B are used in combination. The coupling agent A includes non-polar groups, which can not only reduce a surface tension, but also undergo an addition reaction with a low-dielectric resin system (such as a PPO resin). The coupling agent B includes vinylbenzyl, which has heat resistance, lubricity, and electronic stability, and can rapidly produce free radicals to accelerate a reaction with a low-dielectric resin while enhancing the heat resistance. In addition, a small-molecule short-chain coupling agent is adopted as the coupling agent A, which has a small molecular weight, a large capillary force, and strong permeability and can well penetrate into glass fibers. During the downstream production of a customer prepreg, a resin has a low viscosity at a low-temperature stage, which is conducive to penetration of glass fibers.

(2) Compared with the traditional addition of a surfactant, the use of an alcohol as a cosolvent in the present disclosure can increase the solubilities of the coupling agents, reduce a surface tension of a solution, and promote the binding of the treatment agent to glass fibers; the alcohol can volatilize in the subsequent drying step, which reduces the interference with a reaction between the coupling agents and a resin.

(3) In the present disclosure, a salt of an MA-grafted material is added as a coupling agent additive. Acid anhydride groups in the coupling agent additive can undergo a generalized dehydration reaction with the polar groups (—$NH_2$ and —OH) to produce chemical bonds, such that incompatible polar and non-polar substances are chemically coupled, thereby further strengthening the binding of the coupling agents to a resin.

(4) The present disclosure does not use a fluorocarbon surfactant or a hydrocarbon surfactant, which can reduce the generation of bubbles during use, avoid the addition of a defoaming agent as an ineffective component, and avoid the adsorption of salt ions, thereby affecting the electrical performance of an electronic cloth.

(5) In the present disclosure, an alcohol is adopted as a solvent. The alcohol can produce a large number of hydrogen bonds, ensure the relatively stable existence of silanol produced after hydrolysis of the coupling agents, and reduce a probability of silanol hydroxyl to undergo a condensation reaction.

DETAILED DESCRIPTION OF THE EMBODIMENTS

The present disclosure is further described below through examples, but the present disclosure is not limited to the scope of the described examples. The experimental methods in the following examples which are not specified with specific conditions are conducted according to conventional conditions or according to product instructions.

Example 1

A treatment agent for an electronic-grade low-dielectric fiberglass cloth was prepared from the following raw materials: vinyltriethoxysilane: 1.0%, vinylbenzyltriethoxysilane: 0.7%, a sodium salt of a butadiene-MA copolymer (a molar ratio of butadiene to MA was 6:4, and a molecular weight was 4,000): 1.5%, methanol: 0.15%, acetic acid: 0.25%, and pure water: the balance.

A preparation method was as follows:
(1) The raw materials were accurately weighed according to the formula. The pure water was added to a preparation tank, and stirring was started.
(2) The methanol and the acetic acid were thoroughly mixed by a stirrer and then added to the preparation tank.
(3) The vinyltriethoxysilane and the vinylbenzyltriethoxysilane were added successively to the preparation tank, and a resulting mixture was stirred until a resulting aqueous solution was clear and transparent.
(4) The sodium salt of the butadiene-MA copolymer was added to the preparation tank, and a resulting mixture was thoroughly stirred to obtain the treatment agent for an electronic-grade low-dielectric fiberglass cloth, which had a pH of 4.3 and was stored under low-speed stirring for later use.

Example 2

A treatment agent for an electronic-grade low-dielectric fiberglass cloth was prepared from the following raw materials: vinyltris($\beta$-methoxyethoxy)silane: 0.65%, 0-(vinylbenzyl)propyltriethoxysilane: 0.3%, an amine salt of a butadiene-MA copolymer (a molar ratio of butadiene to MA was 6:4, and a molecular weight was 7,000): 0.4%, methanol: 0.10%, acetic acid: 0.50%, and pure water: the balance.

A preparation method was as follows:
(1) The raw materials were accurately weighed according to the formula. The pure water was added to a preparation tank, and stirring was started.
(2) The methanol and the acetic acid were thoroughly mixed by a stirrer and then added to the preparation tank.
(3) The vinyltris($\beta$-methoxyethoxy)silane and the $\beta$-(vinylbenzyl)propyltriethoxysilane were added successively to the preparation tank, and a resulting mixture was stirred until a resulting aqueous solution was clear and transparent.
(4) The amine salt of the butadiene-MA copolymer was added to the preparation tank, and a resulting mixture was thoroughly stirred to obtain the treatment agent for an electronic-grade low-dielectric fiberglass cloth, which had a pH of 4.6 and was stored under low-speed stirring for later use.

Example 3

A treatment agent for an electronic-grade low-dielectric fiberglass cloth was prepared from the following raw materials: vinyltriethoxysilane: 0.6%, vinylbenzyltriethoxysilane: 0.3%, a sodium salt of a dimethyldiallyl-MA copolymer (a molar ratio of dimethyldiallyl to MA was 6:4, and a molecular weight was 5,500): 0.8%, ethanol: 0.1%, acetic acid: 0.3%, and pure water: the balance.

A preparation method was as follows:
(1) The raw materials were accurately weighed according to the formula. The pure water was added to a preparation tank, and stirring was started.
(2) The ethanol and the acetic acid were thoroughly mixed by a stirrer and then added to the preparation tank.
(3) The vinyltriethoxysilane and the vinylbenzyltriethoxysilane were added successively to the preparation tank, and a resulting mixture was stirred until a resulting aqueous solution was clear and transparent.
(4) The sodium salt of the dimethyldiallyl-MA copolymer was added to the preparation tank, and a resulting mixture was thoroughly stirred to obtain the treatment agent for an electronic-grade low-dielectric fiberglass cloth, which had a pH of 4.5 and was stored under low-speed stirring for later use.

Example 4

A treatment agent for an electronic-grade low-dielectric fiberglass cloth was prepared from the following raw materials: propylenetrimethoxysilane: 0.8%, $\beta$-(vinylbenzyl)propyltriethoxysilane: 0.6%, an amine salt of a dimethyldiallyl-MA copolymer (a molar ratio of dimethyldiallyl to MA was 5:4, and a molecular weight was 5,500): 0.01%, ethanol: 0.15%, acetic acid: 0.1%, and pure water: the balance.

A preparation method was as follows:
(1) The raw materials were accurately weighed according to the formula. The pure water was added to a preparation tank, and stirring was started.
(2) The ethanol and the acetic acid were thoroughly mixed by a stirrer and then added to the preparation tank.
(3) The propylenetrimethoxysilane and the $\beta$-(vinylbenzyl)propyltriethoxysilane were added successively to the preparation tank, and a resulting mixture was stirred until a resulting aqueous solution was clear and transparent.
(4) The amine salt of the dimethyldiallyl-MA copolymer was added to the preparation tank, and a resulting mixture was thoroughly stirred to obtain the treatment agent for an electronic-grade low-dielectric fiberglass cloth, which had a pH of 4.7 and was stored under low-speed stirring for later use.

Example 5

A treatment agent for an electronic-grade low-dielectric fiberglass cloth was prepared from the following raw materials: propylenetrimethoxysilane: 1.2%, $\beta$-(vinylbenzyl)propyltriethoxysilane: 0.8%, an amine salt of a dimethyldiallyl-MA copolymer (a molar ratio of dimethyldiallyl to MA was 5:4, and a molecular weight was 5,500): 0.05%, glycerol: 0.5%, acetic acid: 0.25%, and pure water: the balance.

A preparation method was as follows:
(1) The raw materials were accurately weighed according to the formula. The pure water was added to a preparation tank, and stirring was started.
(2) The glycerol and the acetic acid were thoroughly mixed by a stirrer and then added to the preparation tank.
(3) The propylenetrimethoxysilane and the $\beta$-(vinylbenzyl)propyltriethoxysilane were added successively to the preparation tank, and a resulting mixture was stirred until a resulting aqueous solution was clear and transparent.

(4) The amine salt of the dimethyldiallyl-MA copolymer was added to the preparation tank, and a resulting mixture was thoroughly stirred to obtain the treatment agent for an electronic-grade low-dielectric fiberglass cloth, which had a pH of 4.8 and was stored under low-speed stirring for later use.

Example 6

A treatment agent for an electronic-grade low-dielectric fiberglass cloth was prepared from the following raw materials: propylenetrimethoxysilane: 0.8%, β-(vinylbenzyl)propyltriethoxysilane: 0.5%, an amine salt of a dimethyldiallyl-MA copolymer (a molar ratio of dimethyldiallyl to MA was 5:4, and a molecular weight was 4,500): 1.0%, ethylene glycol (EG): 0.15%, acetic acid: 0.45%, and pure water: the balance.

A preparation method was as follows:
(1) The raw materials were accurately weighed according to the formula. The pure water was added to a preparation tank, and stirring was started.
(2) The EG and the acetic acid were thoroughly mixed by a stirrer and then added to the preparation tank.
(3) The propylenetrimethoxysilane and the β-(vinylbenzyl)propyltriethoxysilane were added successively to the preparation tank, and a resulting mixture was stirred until a resulting aqueous solution was clear and transparent.
(4) The amine salt of the dimethyldiallyl-MA copolymer was added to the preparation tank, and a resulting mixture was thoroughly stirred to obtain the treatment agent for an electronic-grade low-dielectric fiberglass cloth, which had a pH of 4.5 and was stored under low-speed stirring for later use.

Comparative Example 1

This comparative example was different from Example 1 only in that, a sodium salt of a butadiene-MA copolymer, a coupling agent additive, was not added.

Comparative Example 2

This comparative example was different from Example 1 only in that, vinyltriethoxysilane, a coupling agent A, was not added.

Comparative Example 3

This comparative example was different from Example 1 only in that, vinylbenzyltriethoxysilane, a coupling agent B, was not added.

Comparative Example 4

This comparative example was different from Example 1 only in that the coupling agent B was replaced with an equal mass of the amino-coupling agent Dynasylan 1161 (Evonik).

Comparative Example 5

This comparative example was different from Example 1 only in that the methanol was replaced with an equal mass of the surfactant CapstoneFS-63 (DuPont).

Comparative Example 6

This comparative example was different from Example 1 only in that a percentage of the coupling agent A vinyltriethoxysilane was 1.3% and a percentage of the coupling agent B vinylbenzyltriethoxysilane was 1.0%.

Comparative Example 7

This comparative example was different from Example 1 only in that a percentage of the coupling agent A vinyltriethoxysilane was 0.8% and a percentage of the coupling agent B vinylbenzyltriethoxysilane was 0.8%.

Comparative Example 8

Conventional treatment agent: glacial acetic acid: 0.35%, amino-coupling agent Dynasylan 1161: 0.85%, surfactant Capstone FS-63: 0.015%, and water: the balance.

The treatment agents prepared in the examples and comparative examples each were used to treat an electronic-grade low-dielectric fiberglass cloth (2116 cloth) as follows: the electronic-grade low-dielectric fiberglass cloth was first immersed in the treatment agent (room temperature) at a rate of 30 m/min, and then dried at 120° C. A treated electronic-grade low-dielectric fiberglass cloth was subjected to performance tests as follows:

(1) Tensile breaking strength test:

Six strip specimens of 50 mm*250 mm were cut from a sample by a sampler. Upper and lower jaws of a fixture were released to an appropriate width; and one end of a specimen was placed into the fixture such that a longitudinal center line of the specimen passed through a center of a front edge of the fixture, and the other end of the specimen was placed into the fixture in the same way. Before the specimen was finally clamped, a tension was applied evenly over the entire width of the specimen, where the tension was roughly equivalent to (1±0.25)% of a breaking force. A test start option was clicked to start a test. A final test result was automatically calculated and displayed by an instrument.

(2) Thermal stress test:

A sample was placed in a tin furnace at 288° C. to allow a heat resistance test, a stopwatch was started for timing, and the sample was soaked in a tin melt for 10 s. Whether the sample underwent delamination (blistering) was observed, and a number of times that the sample was placed into the tin melt was recorded. If there was delamination (blistering), it indicated that the sample failed.

(3) Heat resistance test:

A sample cooked in a PCT autoclave for 4 h was placed in a tin furnace at 288° C. to allow a heat resistance test, a stopwatch was started for timing, and the sample was soaked in a tin melt for 300 s. Whether the sample underwent delamination (blistering) was observed, and a number of times that the sample was placed into the tin melt was recorded. If there was delamination (blistering), it indicated that the sample failed.

(4) Impregnation performance test:

A surface-treated electronic-grade fiberglass cloth was sampled by a round die machine, where a sample was collected at each of left, middle, and right positions of the cloth; each sample was horizontally placed into a glue with a viscosity of 20±1 s (laboratory temperature: 25° C.), a stopwatch was started, and a change of a white line on a surface of the electronic-grade fiberglass cloth was observed until the surface of the electronic-grade fiberglass cloth was completely impregnated with the resin; and when the white line disappeared, the stopwatch was stopped, and a corresponding time was recorded.

(5) Resin content test:

A sample was placed in a muffle furnace, smoldered at 550±50° C. for 20 min, and then weighed, and a reduced weight of the sample was calculated. Resin content=reduced weight of a sample/an original weight of the sample.

Test results were shown in Tables 1 and 2.

TABLE 1

Test results of the examples

| Item | Example 1 | Example 2 | Example 3 | Example 4 | Example 5 | Example 6 |
|---|---|---|---|---|---|---|
| Horizontal strength (N/25 mm) | 255 | 253 | 242 | 254 | 235 | 239 |
| Longitudinal strength (N/25 mm) | 259 | 257 | 246 | 255 | 239 | 243 |
| 288° C. thermal stress (10 s/time) | 16 | 15 | 13 | 14 | 13 | 15 |
| After plate pressing at 288° C. Heat resistance test (s) | 300 | 300 | 300 | 300 | 300 | 300 |
| Resin penetration time (s) | 565 | 572 | 553 | 576 | 551 | 560 |
| Resin content (%) | 45.7 | 44.8 | 46.2 | 45.4 | 47.2 | 45.8 |

TABLE 2

Test results of the comparative examples

| Item | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Horizontal strength (N/25 mm) | 203 | 198 | 209 | 210 | 195 | 200 | 210 | 201 |
| Longitudinal strength (N/25 mm) | 207 | 202 | 213 | 214 | 199 | 204 | 214 | 205 |
| 288° C. thermal stress (10 s/time) | 11 | 9 | 10 | 11 | 10 | 10 | 9 | 8 |
| After plate pressing at 288° C. Heat resistance test (s) | 15 | 20 | 22 | 86 | 53 | 105 | 46 | 98 |
| Resin penetration time (s) | 805 | 843 | 820 | 805 | 853 | 809 | 833 | 830 |
| Resin content (%) | 42.3 | 41.5 | 40.5 | 39.5 | 41.3 | 41.9 | 40.2 | 42.5 |

What is claimed is:

1. A treatment agent for an electronic-grade low-dielectric fiberglass cloth, comprising the following raw materials in weight percentages: 0.6% to 1.2% of a coupling agent A, 0.3% to 0.8% of a coupling agent B, 0.01% to 1.5% of a coupling agent additive, 0.1% to 0.5% of an alcohol, 0.1% to 0.5% of an acid, and water for the balance, wherein a content ratio of the coupling agent A to the coupling agent B is (1.2-2.3): 1;

the coupling agent A is a vinyl-containing coupling agent; the coupling agent B is a vinylbenzyl-containing coupling agent; and the coupling agent additive is a salt of a maleic anhydride (MA)-grafted copolymer.

2. The treatment agent for the electronic-grade low-dielectric fiberglass cloth according to claim 1, wherein a general structural formula of the coupling agent A is $CH_2=CH(CH2)_nSiX_3$, wherein n is an integer of 0 to 3, and X is methoxy, ethoxy, methoxyethoxy, or acetoxy.

3. The treatment agent for the electronic-grade low-dielectric fiberglass cloth according to claim 1, wherein the coupling agent A is one or more of vinyltriethoxysilane, vinyltris (β-methoxyethoxy)silane, propylenetrimethoxysilane, and vinyltriisopropoxysilane.

4. The treatment agent for the electronic-grade low-dielectric fiberglass cloth according to claim 1, wherein a general structural formula of the coupling agent B is $CH_2=CH(C_6H_4)CH_2(CH_2)_nSiX_3$, wherein n is an integer of 0 to 3, and X is methoxy, ethoxy, methoxyethoxy, or acetoxy.

5. The treatment agent for the electronic-grade low-dielectric fiberglass cloth according to claim 1, wherein the coupling agent B is one or more of vinylbenzyltriethoxysilane, β-(vinylbenzyl)propyltriethoxysilane, vinylbenzyltrimethoxysilane, and vinylbenzylisopropoxysilane.

6. The treatment agent for the electronic-grade low-dielectric fiberglass cloth according to claim 1, wherein the coupling agent additive is one or more of a sodium salt of a butadiene-MA copolymer, an ammonium salt of a butadiene-MA copolymer, a sodium salt of a dimethyldiallyl-MA copolymer, and an amine salt of a dimethyldiallyl-MA copolymer.

7. The treatment agent for the electronic-grade low-dielectric fiberglass cloth according to claim 1, wherein the acid is a small-molecule organic acid with 1 to 5 carbon atoms.

8. The treatment agent for the electronic-grade low-dielectric fiberglass cloth according to claim 1, wherein the alcohol is a small-molecule organic alcohol with 1 to 5 carbon atoms.

9. A preparation method of the treatment agent for the electronic-grade low-dielectric fiberglass cloth according to claim 1, comprising the following steps:

(1) adding pure water to a preparation tank, and starting stirring;

(2) thoroughly mixing the acid and the alcohol by a stirrer, and adding a resulting mixture to the preparation tank;

(3) adding the coupling agent A and the coupling agent B successively to the preparation tank, and stirring until a resulting aqueous solution is clear and transparent; and (4) adding the coupling agent additive to the preparation tank, and thoroughly stirring to obtain the treatment agent for the electronic-grade low-dielectric fiberglass cloth.

10. The preparation method of the treatment agent for the electronic-grade low-dielectric fiberglass cloth according to claim 9, wherein the treatment agent obtained in step (4) has a pH of 4 to 6, and after being prepared, the treatment agent is stored under low-speed stirring for later use.

11. The preparation method of the treatment agent for the electronic-grade low-dielectric fiberglass cloth according to claim 9, wherein a general structural formula of the coupling agent A is $CH_2=CH(CH2)nSiX_3$, wherein n is an integer of 0 to 3, and X is methoxy, ethoxy, methoxyethoxy, or acetoxy.

12. The preparation method of the treatment agent for the electronic-grade low-dielectric fiberglass cloth according to claim 9, wherein the coupling agent A is one or more of vinyltriethoxysilane, vinyltris (β-methoxyethoxy) silane, propylenetrimethoxysilane, and vinyltriisopropoxysilane.

13. The preparation method of the treatment agent for the electronic-grade low-dielectric fiberglass cloth according to claim 9, wherein a general structural formula of the coupling agent B is $CH2=CH(C6H4)CH2(CH2)nSiX_3$, wherein n is an integer of 0 to 3, and X is methoxy, ethoxy, methoxyethoxy, or acetoxy.

14. The preparation method of the treatment agent for the electronic-grade low-dielectric fiberglass cloth according to claim 9, wherein the coupling agent B is one or more of vinylbenzyltriethoxysilane, β-(vinylbenzyl)propyltriethoxysilane, vinylbenzyltrimethoxysilane, and vinylbenzylisopropoxysilane.

15. The preparation method of the treatment agent for the electronic-grade low-dielectric fiberglass cloth according to claim 9, wherein the coupling agent additive is one or more of a sodium salt of a butadiene-MA copolymer, an ammonium salt of a butadiene-MA copolymer, a sodium salt of a dimethyldiallyl-MA copolymer, and an amine salt of a dimethyldiallyl-MA copolymer.

16. The preparation method of the treatment agent for the electronic-grade low-dielectric fiberglass cloth according to claim 9, wherein the acid is a small-molecule organic acid with 1 to 5 carbon atoms.

17. The preparation method of the treatment agent for the electronic-grade low-dielectric fiberglass cloth according to claim 9, wherein the alcohol is a small-molecule organic alcohol with 1 to 5 carbon atoms.

* * * * *